United States Patent [19]

Sheppard

[11] 4,388,705
[45] Jun. 14, 1983

[54] SEMICONDUCTOR MEMORY CIRCUIT
[75] Inventor: Douglas P. Sheppard, Grapevine, Tex.
[73] Assignee: Mostek Corporation, Carrollton, Tex.
[21] Appl. No.: 307,641
[22] Filed: Oct. 1, 1981
[51] Int. Cl.³ .................... G11C 7/00; G11C 17/00
[52] U.S. Cl. .......................... 365/210; 365/104; 365/208
[58] Field of Search ............ 365/104, 205, 207, 208, 365/210

[56] References Cited

U.S. PATENT DOCUMENTS

| | | | |
|---|---|---|---|
| 4,107,548 | 8/1978 | Sakaba et al. | 365/104 |
| 4,150,311 | 4/1979 | Matsuda et al. | 365/205 |
| 4,162,416 | 7/1979 | Beecham et al. | 365/208 |
| 4,196,363 | 4/1980 | Malaviya | 365/208 |
| 4,314,360 | 2/1982 | Higuchi et al. | 365/210 |

FOREIGN PATENT DOCUMENTS 28157  6/1981  European Pat. Off. ............ 365/210

OTHER PUBLICATIONS

IBM Technical Disclosure Bulletin, vol. 24, No. 10, Mar. 1982, pp. 5165-5166, "Dummy Word Decoder", Mao et al.

*Primary Examiner*—George G. Stellar

[57] ABSTRACT

A semiconductor memory circuit (10) has a plurality of word lines (12, 14), column lines (16, 18) and bit lines (20, 22). A memory cell transistor (30) has the gate terminal connected to the word line (12) and the drain and source terminals connected between the bit line (20) and the column line (16). A reference transistor (106) is connected to the word line (12) to provide a reference signal for input to a sense amplifier (136). A data line (54) is connected to the bit line (20) to provide the data state from the data storage transistor (30) to the sense amplifier (136). The data bit line (20) and reference bit line (104) are clamped at different pull down voltages. The memory circuit (10) includes a reference circuit that has reference transistor (106) which operates statically to provide a reference signal for the sense amplifier (136). When the word lines are being sequentially accessed the reference signal produced by the reference circuit rises to a higher average voltage and enhances the operating speed of the memory.

7 Claims, 2 Drawing Figures

SEMICONDUCTOR MEMORY CIRCUIT

TECHNICAL FIELD

The present invention pertains to semiconductor memory circuits and in particular to such circuits which utilize reference memory cells.

BACKGROUND OF THE INVENTION

Semiconductor memory circuits have heretofore been fabricated with reference cells to produce a reference signal for comparison with the output signal from a memory cell. In memory circuits having static references, the reference signal is generated as a fixed voltage which does not vary despite cycling of the memory. At rapid cycling speeds the data signal read from the memory cells can shift as compared to low speed operation thereby reducing the margin between the data voltage and the reference signal voltage. Rapid accessing of such parts can further cause the signal margin at one reference level to become very small thereby increasing the probability of incorrectly reading a data state. Conventional memory circuits have further suffered loss of signal margin due to manufacturing variations and to differences in drive voltages applied to the memory and reference cells.

In view of the above problems encountered in the reading of a memory cell in a semiconductor memory there exists a need for a sensing circuit for use in such a semiconductor memory wherein the memory cells and reference cells track with manufacturing tolerances and receive the same drive voltage for consistent operation. There further exists a need for a sensing circuit wherein the reference signal is dynamic in response to rapid accessing of the memory and the signal margin between the data voltage and the reference signal voltage is sustained to maintain the validity of the data.

SUMMARY OF THE INVENTION

A selected embodiment of the present invention comprises a semiconductor memory circuit which includes a plurality of word lines which are selectively activated in response to an address signal. The memory circuit includes a plurality of memory cell bit lines and a plurality of memory cells each connected to one of the word lines for activation thereby and connected to one of the memory cell bit lines for data transfer therethrough. The memory circuit includes a data line and circuit means responsive to an address signal for selectively connecting one of the memory cell bit lines to the data line. The memory circuit further includes a reference bit line and a plurality of reference cells connected respectively to the word lines for activation thereby. The reference cells are connected to provide a reference signal at the reference bit line wherein the reference signal has a static state when one of the reference cells is activated for a time period greater than the discharge time of the reference bit line. The reference signal has a dynamic state when the reference cells are accessed at a rate having a period less than the discharge time of the reference bit line. Circuit means are provided for clamping the memory cell bit lines to limit a voltage excursion thereof to a first clamp voltage and for clamping the reference bit line to limit a voltage excursion thereof to a second clamp voltage. The first clamp voltage is different from the second clamp voltage. The memory circuit further includes a sense amplifier having first and second inputs connected respectively to the data line and to the reference bit line for generating a data output signal which is a function of the amplitudes of the reference signal and the voltage on the data line.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1:
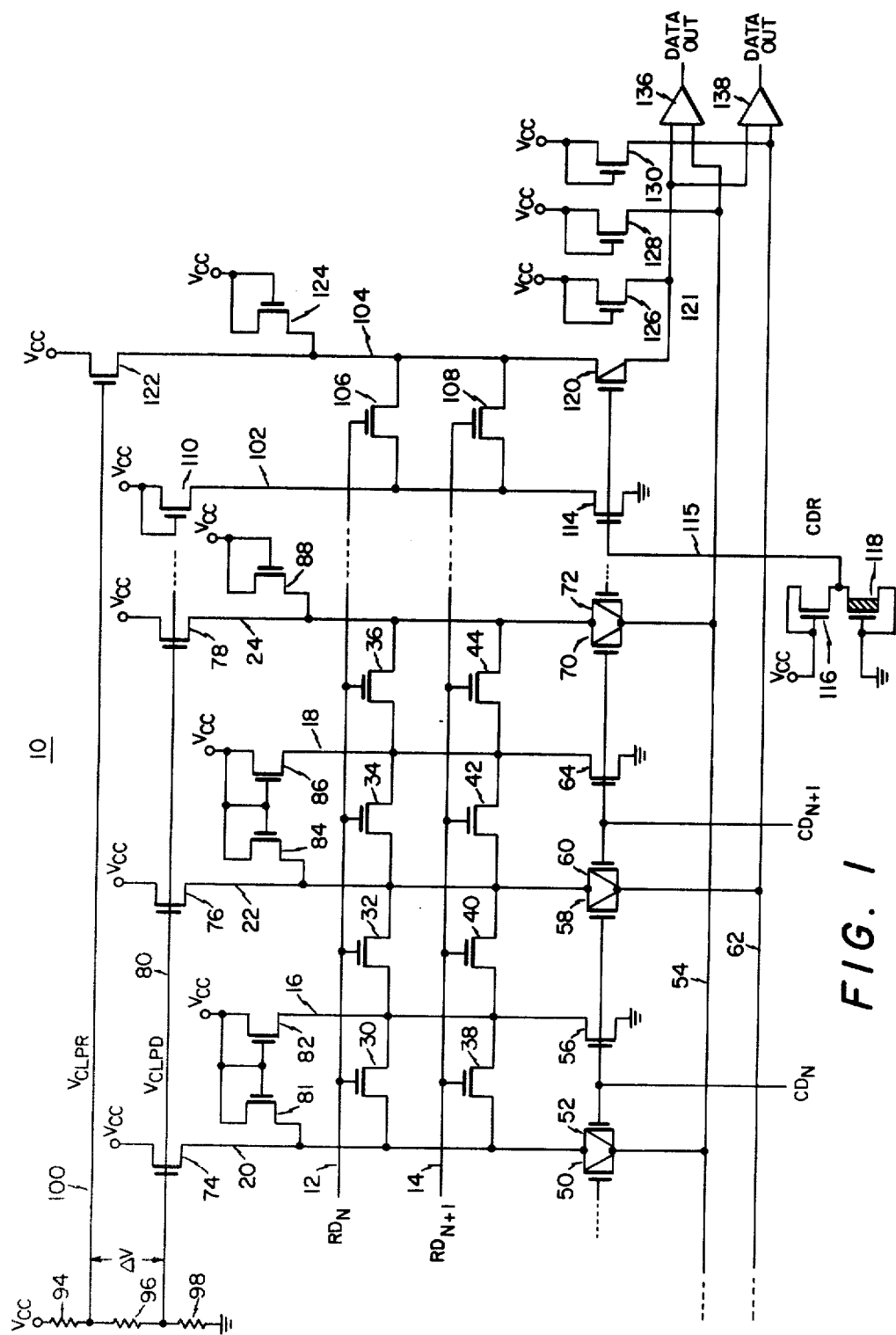
FIG. 1 is a schematic diagram of a read only memory circuit in accordance with the present invention.

The read only memory (ROM) circuit of the present invention is illustrated in FIG. 1 and is designated generally by the reference numeral 10. The ROM circuit 10 includes a plurality of word lines such as lines 12 and 14. These lines receive decoded address signals which are represented as signals $RD_N$ and $RD_{N+1}$. The ROM circuit 10 includes a plurality of column lines, such as lines 16 and 18. Circuit 10 further includes a plurality of bit lines shown as 20, 22 and 24.

Each of the word lines has a plurality of data storage transistors connected thereto. The word line 12 is connected to the gate terminals of memory transistors 30, 32, 34 and 36. The word line 14 is connected to the gate terminals of memory transistors 38, 40, 42 and 44. The memory transistors serve to store data. The drain and source terminals of transistors 30 and 38 are connected between column line 16 and bit line 20. The drain and source terminals of transistors 32 and 40 are connected between column line 16 and bit line 22. The drain and source terminals of transistors 34 and 42 are connected between column line 18 and bit line 22. The drain and source terminals of transistors 36 and 44 are connected between column line 18 and bit line 24.

The bit lines and column lines are selected by operation of column select transistors which are activated by decoded address signals. Depletion transistors 50 and 52 have the drain and source terminals thereof connected in parallel between bit line 20 and a data line 54. A column address signal ($CD_N$) is provided to the gate terminal of transistor 52 for selectively connecting the bit line 20 to the data line 54. A transistor 56 has the drain and source terminals thereof connected between column line 16 and ground and has the gate terminal thereof connected to receive the column signal $CD_N$.

Depletion transistors 58 and 60 have the drain and source terminals thereof connected in parallel between bit line 22 and a data line 62. The gate terminal of transistor 58 is connected to receive the column address signal $CD_N$ and the gate terminal of transistor 60 is connected to receive a column address signal $CD_{N+1}$. A transistor 64 has the drain terminal connected to column line 18 and the source terminal thereof grounded with the gate terminal connected to receive the column address signal $CD_{N+1}$.

Depletion transistors 70 and 72 have the drain and source terminals thereof connected in parallel between bit line 24 and data line 54. The gate terminal of transistor 70 is connected to receive the column address signal $CD_{N+1}$. The gate terminal of transistor 72 is connected to receive the next sequential column address signal.

Clamping transistors 74, 76 and 78 have the source terminals thereof connected respectively to the bit lines 20, 22 and 24. The drain terminals of transistors 74, 76 and 78 are connected to a power terminal $V_{cc}$. The gate terminals of transistors 74, 76 and 78 are connected to a node 80.

Transistors 81 and 82 have the gate and drain terminals thereof connected to $V_{cc}$ with the source terminal of transistor 81 connected to bit line 20 and the source terminal of transistor 82 connected to column line 16. Transistors 84 and 86 have the gate and drain terminals thereof connected to $V_{cc}$ with the source terminal of transistor 84 connected to bit line 22 and the source terminal of transistor 86 connected to column line 18. A transistor 88 has the gate and drain terminals thereof connected to $V_{cc}$ and the source terminal thereof connected to bit line 24.

A voltage divider network comprises serially connected resistors 94, 96 and 98. These resistors are connected between $V_{cc}$ and ground. The junction of resistors 94 and 96 is a node 100 which serves as a first tap and provides a reference clamp voltage ($V_{CLPR}$). The junction of resistors 96 and 98 is connected to node 80 which serves as a second tap and provides a data clamp voltage ($V_{CLPD}$). The voltage difference, $\Delta V$ between the reference and data clamp voltages is a function of the ratios of the impedances of the resistors and is therefore essentially constant despite changes in the absolute impedance magnitudes of resistors 94, 96 and 98.

The ROM circuit 10 includes a reference portion which has a reference column line 102 and a reference bit line 104. Each of the word lines in the ROM circuit 10 is provided with one reference transistor which is the same size and configuration as the memory transistors. A reference transistor 106 has the gate terminal thereof connected to word line 12 and a reference transistor 108 has the gate terminal thereof connected to line 14. The source and drain terminals of transistors 106 and 108 are connected between reference column line 102 and reference bit line 104. A pull-up transistor 110 has the gate and drain terminals thereof connected to $V_{cc}$ and the source terminal thereof connected to line 102.

A transistor 114 has the drain terminal thereof connected to reference bit line 102 and the source terminal thereof grounded. The gate terminal of transistor 114 is connected to a node 115 to receive a static column signal CDR. The signal $CD_R$ is generated by a pair of transistors 116 and 118 and has essentially the same amplitude as the column signal $CD_N$ when selected. The transistor 116 has the gate and drain terminals thereof connected to $V_{cc}$ and the source terminal thereof connected to the node 115. A depletion transistor 118 has the gate and source terminals thereof grounded and the drain terminal thereof connected to the node 115. Line 102 is maintained at a low voltage state corresponding to the voltage on a selected column line.

A depletion transistor 120 has the gate terminal thereof connected to receive the $CD_R$ signal at node 115, the drain terminal thereof connected to line 104 and the source terminal thereof connected to a reference data line 121. A reference signal is generated at line 104 and transmitted through transistor 120 to line 121. A clamping transistor 122 has the gate terminal connected to node 100 for receiving the reference clamp voltage, the drain terminal connected to $V_{cc}$ and the source terminal connected to reference bit line 104.

Pull-up transistors 124, 126, 128 and 130 each have the gate and drain terminals thereof connected to $V_{cc}$ and the source terminals thereof connected respectively to line 104, reference data line 121, data line 54 and data line 62. Each of the transistors 124, 126, 128 and 130 is relatively small and serves to pull the corresponding line toward a high voltage state.

Reference data line 121 and data line 54 provide inputs to a sense amplifier 136 which generates a bi-level output signal dependent upon the relative magnitudes of the input signals provided thereto. Reference data line 121 and data line 62 provide inputs to a sense amplifier 138 which likewise produces a bi-level output signal dependent upon the relative amplitudes of the input signals provided thereto.

Figure 2:
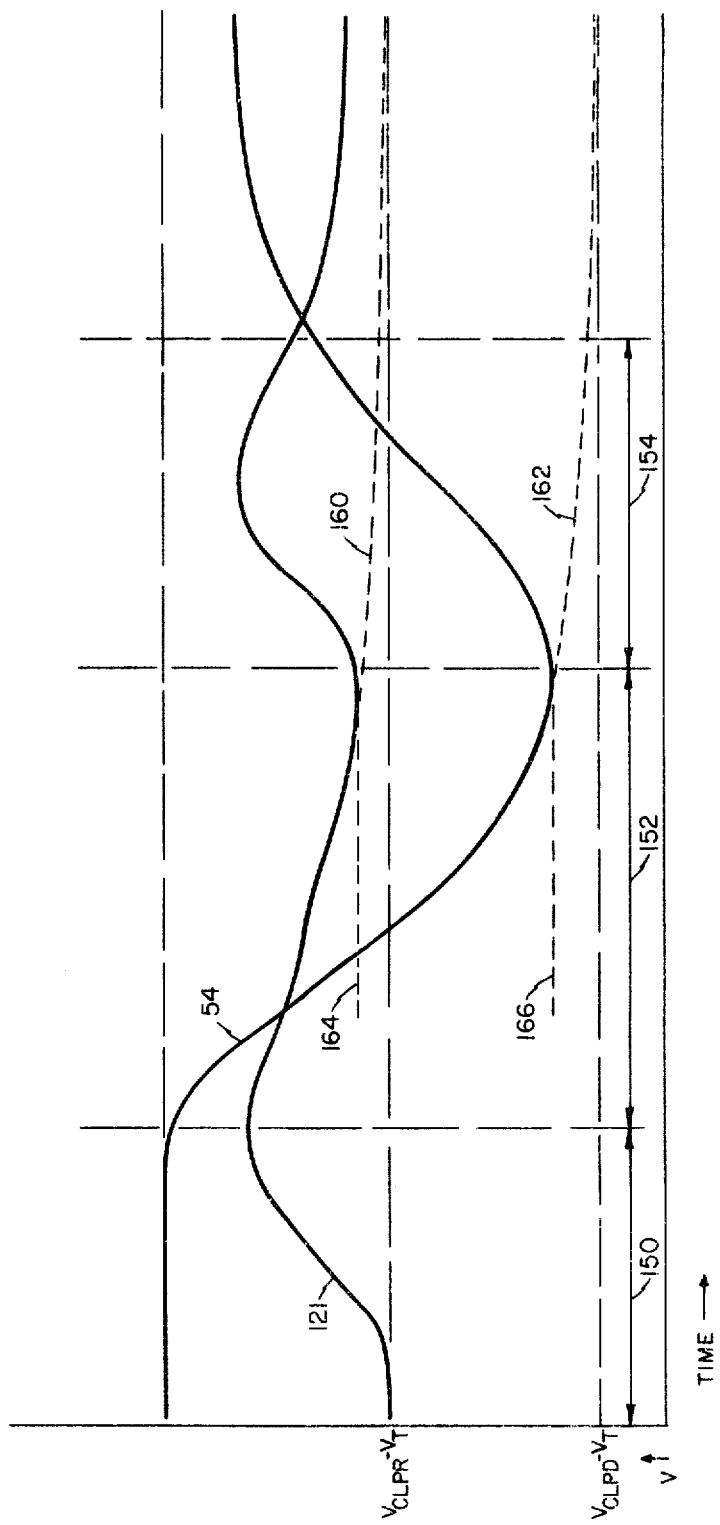
FIG. 2 is an illustration of waveforms which occur in the circuit shown in FIG. 1.

The signals which appear on lines 121 and 54 are illustrated as waveforms in FIG. 2.

Operation of the circuit of the present invention is now made in reference to FIGS. 1 and 2. The circuit of the present invention is illustrated for a read only memory, however, the sensing scheme is equally applicable for a random access memory having both read and write functions. Each address provided to the circuit 10 is decoded to activate a word line and a column line. This serves to select a particular memory transistor. Each of the memory transistors is fabricated to have either a high or low threshold voltage. The memory transistors having a high threshold voltage cannot be turned on by the voltage applied to the gate terminal but the memory transistors having a low threshold voltage will be turned on to provide a conductive path between corresponding column and bit lines.

The reading of data storage transistor 30 will now be described as an example of the operation of circuit 10. The transistors 81 and 82 serve to pull the bit line 20 and column line 16 toward the high voltage state of the supply $V_{cc}$. When the transistor 30 is selected the signal $CD_N$ goes to a high level thereby turning on transistors 52 and 56. The turn on of transistor 56 discharges the column line 16 thereby pulling it to a low voltage state. The turn on of transistor 52 serves to connect the bit line 20 with the data line 54. When transistor 30 is selected the word line 12 likewise goes from a low to a high state. If the transistor 30 has a low threshold voltage it is turned on thereby connecting the bit line 20 with the column line 16. Under this condition the bit line 20 is discharged through transistor 30 to the column line 16. The voltage at the bit line 20 is pulled downward and clamped at a predetermined low level which is essentially one transistor threshold voltage below the data clamp voltage on node 80. This is shown as $V_{CLPD} - V_T$ in FIG. 2. Thus the maximum downward voltage excursion of the bit line 20 is limited by the clamping action of transistor 74.

But if the transistor 30 is fabricated to have a high threshold voltage it cannot be turned on and the bit line 20 will not be connected to the column line 16. The bit line 20, under this condition, will be maintained at a high voltage state.

Thus if the transistor 30 is turned on the data line 54 will be pulled to the clamped voltage of the bit line 20. But if the transistor 30 is not turned on the data line 54 will remain in a high voltage state where it is pulled by operation of transistor 128.

The sensing circuitry of the present invention operates in a static mode in that there is no precharging of any nodes or lines to carry out the sensing function. Each of the reference transistors is turned on whenever the corresponding word line is selected. The signals produced at the data line 54 and the reference data line 121 and shown in FIG. 2 do, however, change voltage levels when there is a rapid sequential activation of different word lines.

The transistor 110 tends to pull the reference column line 102 upward to a high voltage state $V_{cc}$ but line 102 is maintained at a relatively low voltage because transistor 114 is fabricated to be a larger device than transistor 110. When one of the reference transistors 106, 108 is turned on the reference bit line 104 is connected to the reference column line 102 and the voltage on the reference bit line is pulled downward. The bit line 104 is however clamped at a minimum voltage excursion by operation of clamp transistor 122. The reference bit line 104 is clamped at a voltage which is essentially one threshold voltage below the reference clamp voltage at node 100. This is shown in FIG. 2 as $V_{CLPR}-V_T$.

Note in FIG. 2 that the average level of the waveform for line 121 moves upward when a series of word lines are activated. The static level of the voltage on line 121 is $V_{CLPR}-V_T$. Observing from left to right the rise of the voltage at line 121 in a region 150 is due to the turn off of one of the reference transistors. This turn off disconnects bit line 104 from column line 102 permitting transistor 124 to pull line 104 toward $V_{cc}$. As one reference transistor is turned off another is turned on which reconnects bit line 104 to column line 102 to pull down the voltage on line 104. This pull down is shown in region 152. As the second reference transistor is turned off the voltage on line 121 is again pulled upward by transistor 124 as shown in region 154. But this reference voltage cannot be pulled down below the clamp level. As long as the process of continuously selecting new word lines continues at a rate having a period less than the discharge time of line 104 the average level of the reference data signal on line 121 will remain above the initial voltage level. If no word line is activated following region 152 the reference signal on line 121 is discharged along dotted line 160 which shows the discharge rate of line 121. Note that the signal on the line 121 raises to a higher average value when the word lines are accessed at a rate having a period greater than the discharge time of line 121.

The signal on line 54 likewise shifts upward when the word lines are sequentially activated. The static voltage of line 54 is $V_{CLPD}-V_T$. Note that the line 54 decays along a line 162 when the word lines are no longer activated.

Referring further to FIG. 2 the sense amplifiers switch data at approximately the cross over points between the two waveforms. Note that the signal margin is the difference between the two clamp voltage levels for static conditions. For dynamic conditions the signal margin is the voltage difference between lines 164 and 166 which is essentially the same as the margin for the static conditions.

As can be seen in FIG. 2 the signal on line 121 crosses the data signal at an earlier time than would be the case if the reference signal stayed at its initial level. This increase in the average level of the reference signal enhances the operating speed of the memory.

The speed of operating the memory is partially dependent upon the marginal voltage between the reference and data signals. With the circuit of the present invention the signal margin can be easily adjusted by changing the sizes of resistors 94, 96 and 98. Thus the memory circuit 10 can be optimized to have the fastest possible response for the minimum required signal margin.

Although one embodiment of the invention has been illustrated in the accompanying Drawings and described in the foregoing Detailed Description, it will be understood that the invention is not limited to the embodiment disclosed, but is capable of numerous rearrangements, modifications and substitutions without departing from the scope of the invention.

I claim:

1. A semiconductor memory circuit comprising:
   a plurality of word lines which are selectively activated in response to an address signal;
   a plurality of memory cell bit lines;
   a plurality of memory cells each connected to one of said word lines for activation thereby and connected to one of said memory cell bit lines for data transfer therethrough;
   a data line;
   means responsive to an address signal for selectively connecting one of said memory cell bit lines to said data line;
   a reference bit line;
   a plurality of reference cells connected respectively to said word lines for activation thereby said reference cells connected to provide a reference signal at said reference bit line, said reference signal having a static state when one of said reference cells is activated for a time period greater than the discharge time of said reference bit line and said reference signal having a dynamic state when said reference cells are accessed at a rate having a period less than the discharge time of said reference bit line;
   means for clamping said memory cell bit lines to limit a voltage excursion thereof to a first clamp voltage, and for clamping said reference bit line to limit a voltage excursion thereof to a second clamp voltage different from said first clamp voltage; and
   a sense amplifier having first and second inputs connected respectively to said data line and to said reference bit line for generating a data output signal which is a function of the amplitudes of said reference signal and the voltage on said data line.

2. The semiconductor memory circuit recited in claim 1 wherein each of said memory cells is fabricated to have one of a plurality of voltage thresholds wherein each of said voltage thresholds correspond to data states, said memory circuit functioning as a read only memory, and each of said reference cells fabricated to have one of said voltage thresholds.

3. The semiconductor memory circuit recited in claim 1 wherein each of said reference cells in a transistor having a predetermined threshold voltage and having the gate terminal thereof connected to the corresponding word line and the source and drain terminals thereof connected between said reference bit line and a column line.

4. The semiconductor memory circuit recited in claim 1 wherein said means for clamping comprises:
   a plurality of serially connected resistors having first and second taps and connected between first and second power terminals;
   a plurality of first transistors corresponding respectively to said memory cell bit line, each of said first transistors having the gate terminal thereof connected to said first tap, the drain terminal thereof connected to said first power terminal and the source terminal thereof connected to the corresponding memory cell bit line; and a second transistor having the gate terminal thereof connected to said second tap, the drain terminal thereof connected to said first power terminal and the source terminal thereof connected to said bit line.

5. The semiconductor memory circuit recited in claim 1 including means for pulling said bit lines and said data line toward a selected voltage state.

6. A semiconductor read only memory circuit, comprising:
a plurality of word lines which are selectively activated in response to an address signal;
a plurality of memory transistor bit lines;
a plurality of memory transistor column lines;
a plurality of memory transistors each fabricated to have one of a plurality of predetermined voltage thresholds which correspond to data states, each of said memory transistors having the gate terminal thereof connected to a corresponding one of said word lines, the drain and source terminals thereof connected between corresponding ones of said bit lines and said column lines;
means responsive to an address signal for selecting one of said memory transistor bit lines and one of said memory transistor column lines and connecting the selected memory transistor bit lines to said data line and for connecting said selected memory transistor column line to a common node;
a reference bit line;
a reference column line;
a plurality of reference transistors each fabricated to have one of said threshold voltages, said reference transistors having the gate terminals thereof connected respectively to said word lines and having the source and drain terminals thereof connected between said reference bit line and said reference column line, said reference transistors providing a reference signal to said reference bit line;
means for clamping said memory transistor bit lines to limit a voltage excursion thereof to a first clamp voltage and for clamping said reference bit line to limit a voltage excursion thereof to a second clamp voltage different from said first clamp voltage; and
a sense amplifier having first and second inputs connected respectively to said data line and to said reference bit line for generating a data output signal which is a function of the amplitudes of said reference signal and the voltage on said data line.

7. The semiconductor read only memory circuit recited in claim 1 wherein said means for clamping comprises:
a plurality of serially connected resistors forming a voltage divider having first and second taps and connected between first and second power terminals;
a plurality of first transistors corresponding respectively to said memory transistor bit lines, each of said first transistors having the gate terminal thereof connected to said first tap, the drain terminal thereof connected to said first power terminal and the source terminal thereof connected to the corresponding memory transistor bit line; and
a second transistor having the gate terminal thereof connected to said second tap, the drain terminal thereof connected to said first power terminal and the source terminal thereof connected to said reference bit line.

* * * * *